(12) United States Patent
Liu

(10) Patent No.: US 8,071,479 B2
(45) Date of Patent: Dec. 6, 2011

(54) CHEMICAL MECHANICAL POLISHING COMPOSITION AND METHODS RELATING THERETO

(75) Inventor: Zhendong Liu, King of Prussia, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 530 days.

(21) Appl. No.: 12/332,816

(22) Filed: Dec. 11, 2008

(65) Prior Publication Data

US 2010/0151683 A1 Jun. 17, 2010

(51) Int. Cl.
*H01L 21/302* (2006.01)

(52) U.S. Cl. ........... 438/692; 438/691; 438/693; 216/89

(58) Field of Classification Search .................. 438/691, 438/692, 693; 252/79.1, 79.2; 216/88, 89
See application file for complete search history.

(56) References Cited

U.S. PATENT DOCUMENTS

| | | | |
|---|---|---|---|
| 6,117,775 A | 9/2000 | Kondo et al. | |
| 6,375,693 B1 | 4/2002 | Cote et al. | |
| 6,409,781 B1 | 6/2002 | Wojtczak et al. | |
| 6,916,742 B2 | 7/2005 | Ye et al. | |
| 7,300,602 B2 | 11/2007 | Liu et al. | |
| 2003/0194868 A1* | 10/2003 | Miller | 438/689 |
| 2005/0076580 A1* | 4/2005 | Tamboli et al. | 51/307 |
| 2006/0068589 A1 | 3/2006 | Bian | |
| 2006/0110923 A1 | 5/2006 | Liu et al. | |
| 2007/0298611 A1 | 12/2007 | Bian | |
| 2008/0148649 A1* | 6/2008 | Liu | 51/298 |

FOREIGN PATENT DOCUMENTS

| | | |
|---|---|---|
| EP | 1518910 A1 | 3/2005 |
| WO | 2007102138 A2 | 9/2007 |

* cited by examiner

*Primary Examiner* — Lan Vinh
(74) *Attorney, Agent, or Firm* — Thomas S. Deibert

(57) ABSTRACT

A method for chemical mechanical polishing of a substrate comprising a barrier material in the presence of at least one of an interconnect metal and a low-k dielectric material using a chemical mechanical polishing composition comprising water; 1 to 40 wt % abrasive having an average particle size of $\leq 100$ nm; 0.001 to 5 wt % quaternary compound; a material having a formula (I):

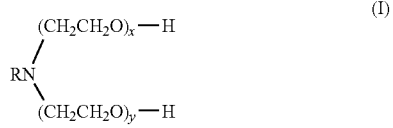

wherein R is selected from $C_2$-$C_{20}$ alkyl, $C_2$-$C_{20}$ aryl, $C_2$-$C_{20}$ aralkyl and $C_2$-$C_{20}$ alkaryl; wherein x is an integer from 0 to 20; wherein y is an integer from 0 to 20; wherein $x+y \geq 1$; and, wherein the chemical mechanical polishing composition has a $pH \leq 5$.

10 Claims, No Drawings

CHEMICAL MECHANICAL POLISHING COMPOSITION AND METHODS RELATING THERETO

The present invention relates to chemical mechanical polishing compositions and methods of using the same. More particularly, the present invention relates to chemical mechanical polishing compositions for polishing a substrate having a barrier material in the presence of a low-k dielectric material.

In recent years, the semiconductor industry has increasingly relied upon copper electrical interconnects in forming integrated circuits. These copper interconnects have a low electrical resistivity and a high resistance to electromigration. Since copper is very soluble in many dielectric materials, such as silicon dioxide and low-K or doped versions of silicon dioxide, a diffusion barrier layer is necessary to prevent the diffusion of copper into the underlying dielectric material. Typical barrier materials include, tantalum, tantalum nitride, tantalum-silicon nitrides, titanium, titanium nitrides, titanium-silicon nitrides, titanium-titanium nitrides, titanium-tungsten, tungsten, tungsten nitrides and tungsten-silicon nitrides.

In response to increasing demands for high density integrated circuits, manufacturers now fabricate integrated circuits containing multiple overlying layers of metal interconnect structures. During device fabrication, planarizing each interconnect layer improves packing density, process uniformity, product quality and most importantly, enables chip manufacturers to fabricate multiple layer integrated circuits. Chip manufacturers rely upon chemical-mechanical-planarizing (CMP) as a cost effective means of producing flat substrate surfaces. The CMP process is typically carried out in a two-step sequence. First, the polishing process uses a "first-step" slurry specifically designed to rapidly remove copper. For example, Carpio et al., in "Initial study on copper CMP slurry chemistries" Thin Solid Films, 262 (1995), disclose the use on a 5 weight percent nitric acid solution for efficient copper removal. Similarly, Kondo et al., in U.S. Pat. No. 6,117,775, disclose the use of nitric acid and BTA for copper removal.

After the initial copper removal, a "second-step" slurry removes the barrier material. Typically, second-step slurries require excellent selectivity to remove the barrier material without adversely impacting the physical structure or electrical properties of the interconnect structure.

Because it was traditionally perceived that alkaline polishing slurries have a much higher Ta/TaN removal rate than acidic slurries, commercial second-step slurries typically have a basic to neutral pH. Another factor pointing to the advantages of neutral to basic pH barrier metal polishing slurries relates to the need to preserve the metal overlying the barrier metal during the second-step polishing. The metal removal rate should be very low to reduce dishing of the metal interconnects.

In acidic slurries that include oxidizing agents, copper tends to have both a high removal rate and a high static etch rate. Cote et al. however, in U.S. Pat. No. 6,375,693, disclose an acidic CMP slurry for barrier materials. The slurry of Cote et al. operates with a hydrogen peroxide oxidizer, a benzotriazole inhibitor and a sulfated fatty acid at a pH range of 2 to 7.5. Similarly, Wojtczak et al., in U.S. Pat. No. 6,409,781, disclose an acidic polishing slurry that relies upon a potassium iodate oxidizer, iminodiacetic acid as the copper corrosion inhibitor and nitric acid as the copper activator to selectively polish the barrier material.

Future low k and ultra-low k integrations of the IC structure will require low metal and dielectric losses in the CMP step. Accordingly, a selective slurry for barrier removal will most probably be adopted. While neutral-to-basic polishing slurries have advantages known to those skilled in the art, such as those described above, these slurries also tend to have low tantalum removal rates. In addition, because tantalum is readily oxidized, the oxidizing agents in the slurry can react with the tantalum to form an oxide layer on the surface.

One polishing composition for removing barrier materials in the presence of interconnect metals and dielectrics is disclosed in U.S. Pat. No. 7,300,602 to Liu et al. Liu et al. disclose a polishing solution useful for removing barrier materials in the presence of interconnect metals and dielectrics comprising 0.1 to 10 weight percent hydrogen peroxide, at least one pH adjusting agent selected from the group consisting of nitric acid, sulfuric acid, hydrochloric acid and phosphoric acid for adjusting a pH level of the polishing solution to less than 3, 0.25 to 1.7 weight percent benzotriazole inhibitor for reducing removal rate of the interconnect metals, 0 to 10 weight percent surfactant, 0.01 to 10 weight percent colloidal silica having an average particle size of less than 50 nm and balance water and incidental impurities, and the polishing solution has a tantalum nitride to copper selectivity of at least 3 to 1 and a tantalum nitride to TEOS selectivity of at least 3 to 1 as measured with a polishing pad pressure measured normal to a wafer less than 15 kPa.

Notwithstanding, there still exists a need for chemical mechanical polishing (CMP) compositions capable of selectively removing barrier materials relative to interconnect metals and dielectric materials.

In one aspect of the present invention, there is provided a method for chemical mechanical polishing of a substrate, comprising: providing a substrate, wherein the substrate comprises a barrier material in the presence of at least one of an interconnect metal and a low-k dielectric material; providing a chemical mechanical polishing composition, wherein the chemical mechanical polishing composition comprises water; 1 to 40 wt % abrasive having an average particle size of $\leq 100$ nm; 0 to 10 wt % oxidizer; 0.001 to 5 wt % quaternary compound; a material having a formula (I):

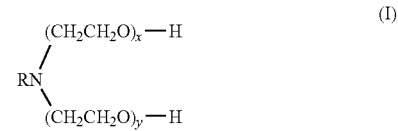

wherein R is selected from $C_2$-$C_{20}$ alkyl, $C_2$-$C_{20}$ aryl, $C_2$-$C_{20}$ aralkyl and $C_2$-$C_{20}$ alkaryl; wherein x is an integer from 0 to 20; wherein y is an integer from 0 to 20; wherein x+y$\geq$1; wherein the chemical mechanical polishing composition has a pH$\leq$5; providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein at least some of the barrier material is removed from the substrate.

In another aspect of the present invention, there is provided a method for chemical mechanical polishing of a substrate, comprising: providing a substrate, wherein the substrate comprises a barrier material in the presence of at least one of an interconnect metal and a low-k dielectric material; providing a chemical mechanical polishing composition, wherein the chemical mechanical polishing composition comprises water; 1 to 5 wt % colloidal silica abrasive having an average particle size of 20 to 30 nm; 0.05 to 0.8 wt % oxidizer; 0 to 10 wt % inhibitor; 0.001 to 5 wt % quaternary compound selected from tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetra-tertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof; 0.01 to 0.1 wt % of a material having a formula (I):

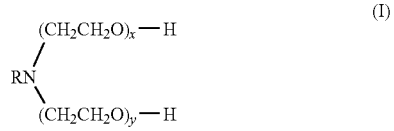

wherein R is a $C_8$-$C_{20}$ alkyl derived from a natural source selected from soy, tallow, coconut, palm oil and castor oil; wherein x is an integer from 0 to 20; wherein y is an integer from 0 to 20; wherein $x+y \geqq 1$; wherein the chemical mechanical polishing composition has a $pH \leqq 5$; providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein at least some of the barrier material is removed from the substrate.

DETAILED DESCRIPTION

The chemical mechanical polishing method of the present invention is useful for polishing a substrate comprising a barrier material in the presence of at least one of copper and a low-k dielectric material. The chemical mechanical polishing composition used in the method of the present invention provides a high barrier material removal rate with favorable selectivity over other materials on the substrate.

In the chemical mechanical polishing method of the present invention, the barrier material can be selected from tantalum, tantalum nitride, tantalum-silicon nitride, titanium, titanium nitride, titanium-silicon nitride, titanium-titanium nitride, titanium-tungsten nitride, tungsten, tungsten nitride and tungsten-silicon nitride. Preferably, the barrier material is tantalum nitride.

For purposes of this specification, low-k dielectric includes low k and ultra low k materials (some ultra low k materials are not silica-based). To polish low k and ultra low k dielectric materials, it is important to maintain low down force pressures during polishing to minimize the delamination or fracture of these materials. Low down force pressures, however, tend to yield low barrier material removal rates, which is undesirable from a wafer throughput perspective. The chemical mechanical polishing compositions of the present invention demonstrate high barrier removal rates in comparison to conventional acidic polishing solutions that operate at low down force pressures.

The chemical mechanical polishing composition used in the chemical mechanical polishing method of the present invention comprises: water, an abrasive, a quaternary compound, and a material having a formula (I):

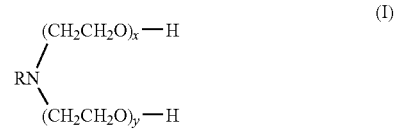

wherein R is selected from $C_2$-$C_{20}$ alkyl, $C_2$-$C_{20}$ aryl, $C_2$-$C_{20}$ aralkyl and $C_2$-$C_{20}$ alkaryl; preferably $C_2$-$C_{20}$ alkyl; more preferably $C_8$-$C_{20}$ alkyl; most preferably $C_8$-$C_{20}$ alkyl derived from a natural source selected from soy, tallow, coconut, palm oil and castor oil; wherein x is an integer from 0 to 20, preferably an integer from 1 to 10, more preferably an integer from 2 to 10, most preferably an integer from 2 to 5; wherein y is an integer from 0 to 20, preferably an integer from 1 to 10, more preferably an integer from 2 to 10, most preferably an integer from 2 to 5; wherein $x+y \geqq 1$; and wherein the chemical mechanical polishing composition has a pH of $\leqq 5$.

The water contained in the chemical mechanical polishing composition used in the chemical mechanical polishing method of the present invention is preferably at least one of deionized and distilled to limit incidental impurities.

Abrasive suitable for use in the chemical mechanical polishing composition used in the chemical mechanical polishing method of the present invention include, for example, inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Modified forms of these inorganic oxides, such as, organic polymer-coated inorganic oxide particles and inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Preferably, the abrasive is a colloidal silica abrasive. Colloidal silica abrasive suitable for use in the present method for chemical mechanical polishing contain at least one of fumed silica, precipitated silica and agglomerated silica.

In some embodiments of the present invention, the abrasive used in the chemical mechanical polishing composition is a colloidal silica having an average particle size of $\leqq 100$ nm. In some aspects of these embodiments, the colloidal silica has an average particle size of 1 to 100 nm. In some aspects of these embodiments, the colloidal silica has an average particle size of 1 to 50 nm. In some aspects of these embodiments, the colloidal silica has an average particle size of 1 to 40 nm. In some aspects of these embodiments, the colloidal silica has an average particle size of 1 to 30 nm. In some aspects of these embodiments, the colloidal silica has an average particle size of 20 to 30 nm.

In some embodiments of the present invention, the chemical mechanical polishing composition used contains 1 to 40 wt % abrasive. In some aspects of these embodiments, the chemical mechanical polishing composition used contains 1 to 25 wt % abrasive. In some aspects of these embodiments, the chemical mechanical polishing composition used contains 1 to 10 wt % abrasive. In some aspects of these embodiments, the chemical mechanical polishing composition used contains 1 to 5 wt % abrasive.

In some embodiments of the present invention, the chemical mechanical polishing composition used contains 1 to 40 wt %, preferably 1 to 25 wt %, more preferably 1 to 10 wt %, most preferably 1 to 5 wt % colloidal silica abrasive, wherein the colloidal silica abrasive has an average particle size of ≦100, preferably 1 to 100 nm, more preferably 1 to 50 nm, still more preferably 1 to 40 nm, yet still more preferably 1 to 30 nm, most preferably 20 to 30 nm.

In some embodiments of the present invention, the chemical mechanical polishing composition used in the chemical mechanical polishing method of the present invention contains 0 to 10 wt %, preferably 0.001 to 5 wt %, more preferably 0.01 to 5 wt %, most preferably 0.05 to 0.8 wt % oxidizer. Oxidizers suitable for use in the chemical mechanical polishing composition used in the method of the present invention include, for example, hydrogen peroxide ($H_2O_2$), monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, copper salts, chromium salts, cobalt salts, halogens, hypochlorites and a mixture thereof. Preferably, the oxidizer used in the chemical mechanical polishing composition used in the method of the present invention is hydrogen peroxide. When the chemical mechanical polishing composition contains an unstable oxidizing agent such as, hydrogen peroxide, it is preferable to incorporate the oxidizer into the chemical mechanical polishing composition at the point of use.

The chemical mechanical polishing composition used in the chemical mechanical polishing method of the present invention contains 0.001 to 5 wt %; more preferably 0.005 to 3 wt %; still more preferably 0.01 to 2 wt % of a quaternary compound. Quaternary compounds suitable for use in the chemical mechanical polishing composition include quaternary ammonium compounds, quaternary phosphonium compounds and quaternary antimonium compounds; preferably quaternary ammonium compounds. In some embodiments of the present invention, the quaternary compound is a quaternary ammonium compound selected from tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetratertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof. Most preferably, the quaternary compound is tetrabutylammonium hydroxide (TBAH).

In some embodiments of the present invention, the chemical mechanical polishing composition used contains 0.001 to 5 wt % tetrabutyl ammonium hydroxide (TBAH). In some aspects of these embodiments, the chemical mechanical polishing composition contains 0.005 to 3 wt % tetrabutyl ammonium hydroxide (TBAH). In some aspects of these embodiments, the chemical mechanical polishing composition contains 0.01 to 2 wt % tetrabutyl ammonium hydroxide (TBAH).

The chemical mechanical polishing composition used in the chemical mechanical polishing method of the present invention contains a material having a formula (I):

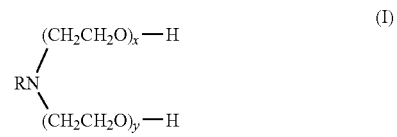

wherein R is selected from $C_2$-$C_{20}$ alkyl, $C_2$-$C_{20}$ aryl, $C_2$-$C_{20}$ aralkyl and $C_2$-$C_{20}$ alkaryl; preferably $C_2$-$C_{20}$ alkyl; more preferably $C_8$-$C_{20}$ alkyl; most preferably $C_8$-$C_{20}$ alkyl derived from a natural source selected from soy, tallow, coconut, palm oil and castor oil; wherein x is an integer from 0 to 20, preferably an integer from 1 to 10, more preferably an integer from 2 to 10, most preferably an integer from 2 to 5; wherein y is an integer from 0 to 20, preferably an integer from 1 to 10, more preferably an integer from 2 to 10, most preferably an integer from 2 to 5; wherein x+y≧1. Preferably, the chemical mechanical polishing composition used in the chemical mechanical polishing method of the present invention contains 0.001 to 1 wt %, more preferably 0.005 to 0.1 wt %, still more preferably 0.01 to 0.1 wt %, most preferably 0.01 to 0.05 wt % of a material having a formula (I).

The chemical mechanical polishing composition used in the chemical mechanical polishing method of the present invention optionally contains an inhibitor to control the removal of nonferrous metal interconnects, such as copper, by static etch or other removal mechanism. Adjusting the concentration of the inhibitor adjusts the nonferrous metal interconnect removal rate by protecting the nonferrous metal interconnect from static etch. The chemical mechanical polishing composition used in the chemical mechanical polishing method of the present invention contains 0 to 10 wt %, preferably 0.001 to 10 wt %, more preferably 0.05 to 2 wt % of an inhibitor. Inhibitors suitable for use in the chemical mechanical polishing composition used include, for example, azole inhibitors, which are particularly effective for polishing wafers having copper and silver interconnects. When polishing substrates having copper or silver interconnects, the inhibitor is preferably selected from benzotriazole (BTA), mercaptobenzothiazole (MBT), tolytriazole (TTA), imidazole and combinations thereof. Most preferably, when polishing substrates having copper or silver interconnects, the inhibitor is BTA. Combinations of azole inhibitors can increase or decrease the copper removal rate.

The chemical mechanical polishing composition used in the chemical mechanical polishing method of the present invention optionally contains an anti-yellowing agent. The chemical mechanical polishing composition used in the chemical mechanical polishing method of the present invention contains 0 to 1 wt %, preferably 0.0001 to 1 wt % anti-yellowing agent. Anti-yellowing agents suitable for use in the chemical mechanical polishing composition used include, for example, iminodiacetic acid (IDA); ethylenediaminetetraacetic acid (EDTA); acetic acid; citric acid; ethyl acetoacetate; glycolic acid; lactic acid; malic acid; oxalic acid; salicylic acid; sodium diethyl dithiocarbamate; succinic acid; tartaric acid; thioglycolic acid; glycine; alanine; aspartic acid; ethylene diamine; trimethyl diamine; malonic acid; gluteric acid; 3-hydroxybutyric acid; propionic acid; phthalic acid; isophthalic acid; 3-hydroxy salicylic acid; 3,5-dihydroxy salicylic acid; gallic acid; gluconic acid; pyrocatechol; pyrogallol; tannic acid; salts and mixtures thereof. Preferably, anti-yellowing agent is selected from iminodiacetic acid (IDA), ethylenediaminetetraacetic acid (EDTA), acetic acid, citric acid, ethyl acetoacetate, glycolic acid, lactic acid, malic acid, oxalic acid and mixtures thereof. More preferably, the anti-yellowing agent is selected from iminodiacetic acid (IDA), ethylenediaminetetraacetic acid (EDTA), citric acid, malic acid and mixtures thereof.

The chemical mechanical polishing composition used in the chemical mechanical polishing method of the present invention optionally further comprises additional additives selected from dispersants, surfactants, buffers, anti-foaming agents and biocides.

The chemical mechanical polishing composition used in the chemical mechanical polishing method of the present invention has a pH of $\leq 5$, preferably 2 to 4, more preferably 2 to 3. The chemical mechanical polishing composition used can include an inorganic pH adjusting agent. In some embodiments of the present invention, the pH adjusting agent is selected from an inorganic acid (e.g., nitric acid, sulfuric acid, hydrochloric acid and phosphoric acid). In some aspects of these embodiments, the pH adjusting agent is nitric acid ($HNO_3$). In some aspects of these embodiments, the pH adjusting agent is phosphoric acid.

At a pH below 3, the chemical mechanical polishing composition can provide a high barrier metal removal rate, even with a relatively low abrasive concentration. This low abrasive concentration can improve the polishing performance of the chemical mechanical polishing process by reducing undesired abrasive induced defects, such as scratching. Also, at a pH below 3, the chemical mechanical polishing composition can be formulated with abrasive particles having a relatively small particle size. For example, a particle size of as small as approximately 10 nm still provides an acceptable barrier material (e.g., Ta/TaN) removal rate. By employing an abrasive having a relatively small particle size and formulating an acidic chemical mechanical polishing composition at a low abrasive concentration, polishing defects are reduced to excellent levels.

The chemical mechanical polishing composition used in the chemical mechanical polishing method of the present invention enables operation with a low nominal polishing pad pressure, for example at 7.5 to 15 kPa and, in certain cases, even below 7.5 kPa. The low nominal polishing pad pressure improves polishing performance by reducing scratching and other undesired polish defects and minimizes damage to fragile materials. For example, low dielectric constant materials fracture or delaminate, if exposed to high compressive forces. Further, the high barrier metal removal rate obtained using the chemical mechanical polishing composition in the chemical mechanical polishing method of the present invention enables effective barrier metal polishing using a low abrasive concentration and a small particle size.

In some embodiments of the present invention, the substrate comprises tantalum nitride in the presence of copper. In some aspects of these embodiments, the chemical mechanical polishing composition exhibits a tantalum nitride to copper removal rate selectivity of $\geq 2$, preferably $\geq 5$, more preferably $\geq 10$. In some aspects of these embodiment, the chemical mechanical polishing composition exhibits a tantalum nitride to copper removal rate selectivity of $\geq 2$ to 50, preferably $\geq 5$ to 50, more preferably of 5 to 20.

In some embodiments of the present invention, the substrate comprises tantalum nitride in the presence of a low-k dielectric, carbon-doped oxide film. In some aspects of these embodiments, the chemical mechanical polishing composition exhibits a tantalum nitride to low-k dielectric, carbon-doped oxide film removal rate selectivity of $\geq 3$; more preferably $\geq 5$; still more preferably $\geq 10$; most preferably $\geq 20$. In some aspects of these embodiments, the chemical mechanical polishing composition exhibits a tantalum nitride to low-k dielectric, carbon-doped oxide film removal rate selectivity of $\geq 3$ to 150; more preferably $\geq 5$ to 150; still more preferably $\geq 10$ to 130; most preferably $\geq 20$ to 130.

In some embodiments of the present invention, the chemical mechanical polishing composition used in the chemical mechanical polishing method comprises: water; 1 to 40 wt %, preferably 1 to 25 wt %, more preferably 1 to 10 wt % most preferably 1 to 5 wt % abrasive having an average particle size of $\leq 100$ nm, preferably 1 to 100 nm, more preferably 1 to 50 nm, still more preferably 1 to 40 nm, most preferably 20 to 30 nm; 0 to 10 wt %, preferably 0.001 to 5 wt %, more preferably 0.01 to 5 wt %, most preferably 0.05 to 0.8 wt % hydrogen peroxide oxidizer; 0.001 to 5 wt % quaternary compound selected from tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetra-tertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof, preferably selected from tetraethyl ammonium hydroxide, tetrabutyl ammonium hydroxide and mixtures thereof, most preferably tetrabutyl ammonium hydroxide; 0.001 to 0.1 wt %, preferably 0.005 to 0.1 wt %, more preferably 0.01 to 0.1 wt %, most preferably 0.01 to 0.05 wt % of a material having a formula (I):

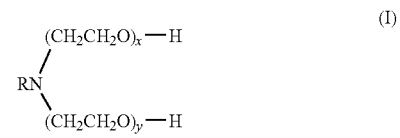

wherein R is selected from $C_2$-$C_{20}$ alkyl, $C_2$-$C_{20}$ aryl, $C_2$-$C_{20}$ aralkyl and $C_2$-$C_{20}$ alkaryl; preferably $C_2$-$C_{20}$ alkyl; more preferably $C_8$-$C_{20}$ alkyl; most preferably $C_8$-$C_{20}$ alkyl derived from a natural source selected from soy, tallow, coconut, palm oil and castor oil; wherein x is an integer from 0 to 20, preferably an integer from 1 to 10, more preferably an integer from 2 to 10, most preferably an integer from 2 to 5; wherein y is an integer from 0 to 20, preferably an integer from 1 to 10, more preferably an integer from 2 to 10, most preferably an integer from 2 to 5; wherein $x+y \geq 1$; 0 to 10 wt %, preferably 0.001 to 10 wt %, more preferably 0.005 to 2 wt % inhibitor; and 0 to 1 wt %, preferably 0.0001 to 1 wt % anti-yellowing agent; wherein the chemical mechanical polishing composition has a $pH \leq 5$, preferably 2 to 4, more preferably 2 to 3; providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein at least some of the barrier material is removed from the substrate. In some aspects of these embodiments, the substrate comprises tantalum nitride in the presence of copper or a low-k dielectric, carbon-doped oxide film (e.g., Coral® low-k dielectric, carbon-doped oxide film wafers available from Novellus Systems, Inc.). In some aspects of these embodiments, the chemical mechanical polishing composition exhibits a tantalum nitride to copper removal rate selectivity of $\geq 2$, preferably $\geq 5$, most preferably 5 to 15, with a platen speed of 93 revolutions per minute, a carrier speed of 87 revolutions per minute, a chemical mechanical polishing composition flow rate of 200 ml/min, and a nominal down force of 1.5 psi on a 200 mm polishing machine where the chemical mechanical polishing pad comprises a polyurethane polishing layer containing polymeric hollow core microparticles and a polyurethane impregnated non-woven subpad. In some aspects of these embodiments, the chemical mechanical polishing composition exhibits a tantalum nitride to low-k dielectric, carbon-doped oxide film removal rate selectivity of $\geq 3$, more preferably $\geq 5$, still more preferably $\geq 10$, yet still more preferably $\geq 20$, most preferably 20 to 130 with a platen speed of 93 revolutions per minute, a carrier speed of 87 revolutions per minute, a chemical mechanical polishing composition flow rate of 200 ml/min, and a nominal down force of 1.5 psi on a 200 mm polishing machine where the chemical mechanical polishing pad comprises a polyurethane polishing layer containing polymeric hollow core microparticles and a polyurethane impregnated non-woven subpad. In some aspects of these embodiments, the chemical mechanical polishing composition also exhibits a tantalum nitride removal rate of $\geq 800$ Å/min, preferably $\geq 1,000$ Å/min, more preferably $\geq 1,500$ Å/min, still more preferably 1,000 to 2,500 Å/min, most preferably 1,500 to 2,000 Å/min with a platen speed of 93 revolutions per minute, a carrier speed of 87 revolutions per minute, a chemical mechanical polishing composition flow rate of 200 ml/min, and a nominal down force of 1.5 psi on a 200 mm polishing machine where the chemical mechanical polishing pad comprises a polyurethane polishing layer containing polymeric hollow core microparticles and a polyurethane impregnated non-woven subpad.

In some embodiments of the present invention, the chemical mechanical polishing composition used in the chemical mechanical polishing method comprises: water; 1 to 40 wt %, preferably 1 to 25 wt %, more preferably 1 to 10 wt % most preferably 1 to 5 wt % colloidal silica abrasive having an average particle size of $\leq 100$ nm, preferably 1 to 100 nm, more preferably 1 to 50 nm, still more preferably 1 to 40 nm, most preferably 20 to 30 nm; 0 to 10 wt %, preferably 0.001 to 5 wt %, more preferably 0.01 to 5 wt %, most preferably 0.05 to 0.8 wt % hydrogen peroxide oxidizer; 0.001 to 5 wt %, preferably 0.005 to 3 wt %, more preferably 0.01 to 2 wt % quaternary compound selected from tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetratertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof, preferably selected from tetraethyl ammonium hydroxide, tetrabutyl ammonium hydroxide and mixtures thereof, most preferably tetrabutyl ammonium hydroxide; 0.001 to 0.1 wt %, preferably 0.005 to 0.1 wt %, more preferably 0.01 to 0.1 wt %, most preferably 0.01 to 0.05 wt % of a material having a formula (I):

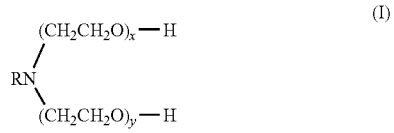

(I)

wherein R is selected from $C_2$-$C_{20}$ alkyl, $C_2$-$C_{20}$ aryl, $C_2$-$C_{20}$ aralkyl and $C_2$-$C_{20}$ alkaryl; preferably $C_2$-$C_{20}$ alkyl; more preferably $C_8$-$C_{20}$ alkyl; most preferably $C_8$-$C_{20}$ alkyl derived from a natural source selected from soy, tallow, coconut, palm oil and castor oil; wherein x is an integer from 0 to 20, preferably an integer from 1 to 10, more preferably an integer from 2 to 10, most preferably an integer from 2 to 5; wherein y is an integer from 0 to 20, preferably an integer from 1 to 10, more preferably an integer from 2 to 10, most preferably an integer from 2 to 5; wherein $x+y \geq 1$; 0 to 10 wt %, preferably 0.001 to 10 wt %, more preferably 0.005 to 2 wt % inhibitor; and 0 to 1 wt %, preferably 0.0001 to 1 wt % anti-yellowing agent; wherein the chemical mechanical polishing composition has a $pH \leq 5$, preferably 2 to 4, more preferably 2 to 3; providing a chemical mechanical polishing pad; creating dynamic contact at an interface between the chemical mechanical polishing pad and the substrate; and dispensing the chemical mechanical polishing composition onto the chemical mechanical polishing pad at or near the interface between the chemical mechanical polishing pad and the substrate; wherein at least some of the barrier material is removed from the substrate. In some aspects of these embodiments, the substrate comprises tantalum nitride in the presence of copper or a low-k dielectric, carbon-doped oxide film (e.g., Coral® low-k dielectric, carbon-doped oxide film wafers available from Novellus Systems, Inc.). In some aspects of these embodiments, the chemical mechanical polishing composition exhibits a tantalum nitride to copper removal rate selectivity of $\geq 2$, preferably $\geq 5$, more preferably 5 to 15, with a platen speed of 93 revolutions per minute, a carrier speed of 87 revolutions per minute, a chemical mechanical polishing composition flow rate of 200 ml/min, and a nominal down force of 1.5 psi on a 200 mm polishing machine where the chemical mechanical polishing pad comprises a polyurethane polishing layer containing polymeric hollow core microparticles and a polyurethane impregnated non-woven subpad. In some aspects of these embodiments, the chemical mechanical polishing composition exhibits a tantalum nitride to low-k dielectric, carbon-doped oxide film removal rate selectivity of $\geq 3$, more preferably $\geq 5$, still more preferably $\geq 10$, yet still more preferably $\geq 20$, most preferably $\geq 20$ to 130 with a platen speed of 93 revolutions per minute, a carrier speed of 87 revolutions per minute, a chemical mechanical polishing composition flow rate of 200 ml/min, and a nominal down force of 1.5 psi on a 200 mm polishing machine where the chemical mechanical polishing pad comprises a polyurethane polishing layer containing polymeric hollow core microparticles and a polyurethane impregnated non-woven subpad. In some aspects of these embodiments, the chemical mechanical polishing composition also exhibits a tantalum nitride removal rate of $\geq 800$ Å/min, preferably $\geq 1,000$ Å/min, more preferably $\geq 1,500$ Å/min, still more preferably 1,000 to 2,500 Å/min, most preferably 1,500 to 2,000 Å/min with a platen speed of 93 revolutions per minute, a carrier speed of 87 revolutions per minute, a chemical mechanical polishing composition flow rate of 200 ml/min, and a nominal down force of 1.5 psi on a 200 mm polishing machine where the chemical mechanical polishing pad comprises a polyurethane polishing layer containing polymeric hollow core microparticles and a polyurethane impregnated non-woven subpad.

Some embodiments of the present invention will now be described in detail in the following Examples.

Examples

Chemical Mechanical Polishing Compositions

The chemical mechanical polishing compositions (CMPC's) tested are described in Table 1. The chemical mechanical polishing composition A is a comparative formulation, which is not within the scope of the claimed invention.

TABLE 1

| CMPC | TBAH (wt %) | EDTA acid form (wt %)[††] | Material of Formula I[¥] (wt %) | Abrasive[£] (wt %) | H₂O₂ (wt %) | Final pH |
|---|---|---|---|---|---|---|
| A | 0.085 | 0.003842 | 0 | 4 | 0.6 | 2.8 |
| 1 | 0.085 | 0.003842 | 0.02 | 4 | 0.6 | 2.8 |
| 2 | 0.085 | 0.003842 | 0.10 | 4 | 0.6 | 2.8 |
| 3 | 0.085 | 0.003842 | 0.02 | 4 | 0.6 | 2.8 |
| 4 | 0.085 | 0.003842 | 0.10 | 4 | 0.6 | 2.8 |
| 5 | 0.085 | 0.003842 | 0.02 | 4 | 0.6 | 2.8 |
| 6 | 0.085 | 0.003842 | 0.10 | 4 | 0.6 | 2.8 |

[¥]The material of formula I used in Examples 1 and 2 was Chemeen® S-2, the material of formula I used in Examples 3 and 4 was Chemeen® S-5 and the material of formula I used in Examples 5 and 6 was Chemeen® T-5. The Chemeen® materials used in the Examples are commercially available from PCC Chemax Inc.
[£]The abrasive used in the Examples was Klebosol® PL1598B25 colloidal silica manufactured by AZ Electronic Materials.

Polishing Tests

The chemical mechanical polishing compositions described in Table 1 were tested using 200 mm blanket wafers, specifically (A) TEOS dielectric wafers; (B) Coral® low-k dielectric, carbon-doped oxide film wafers (available from Novellus Systems, Inc.); (C) tantalum nitride wafers; and (D) electroplated copper wafers. A Strasbaugh nSpire™ CMP system model 6EC rotary type polishing platform was used to polish all of the blanket wafers in the Examples using a VisionPad™ 3500 polyurethane polishing pad with a 1010 groove pattern (commercially available from Rohm and Haas Electronic Materials CMP Inc.). The polishing conditions used in all of the Examples included a platen speed of 93 rpm; a carrier speed of 87 rpm; with a polishing medium flow rate of 200 ml/min and a downforce of 1.5 psi. Removal rates for each of the polish experiments are provided in Table 2. Note that the removal rates were calculated from the before and after polish film thickness on the blanket wafers. Specifically, the removal rates for the Coral® wafers and the TEOS wafers were determined using a SpectraFX 200 optical thin-film metrology system available from KLA-Tencor. The removal rates for the electroplated copper wafers and the tantalum nitride wafers were determined using a ResMap model 168 four point probe resistivity mapping system from Creative Design Engineering, Inc.

TABLE 2

| CMPC | TEOS removal rate (Å/min) | Coral® removal rate (Å/min) | Tantalum Nitride removal rate (Å/min) | Copper removal rate (Å/min) |
|---|---|---|---|---|
| A | 928 | 141 | 1488 | 381 |
| 1 | 682 | 18 | 1585 | 269 |
| 2 | 8 | 23 | 17 | 310 |
| 3 | 720 | 17 | 1560 | 260 |
| 4 | 294 | 15 | 317 | 28 |
| 5 | 778 | 12 | 1528 | 208 |
| 6 | 106 | 30 | 22 | 216 |

I claim:

1. A method for chemical mechanical polishing of a substrate, comprising:
providing a substrate, wherein the substrate comprises a barrier material in the presence of at least one of an interconnect metal and a low-k dielectric material;
providing a chemical mechanical polishing composition, wherein the chemical mechanical polishing composition comprises water; 1 to 40 wt % abrasive having an average particle size of ≦100 nm; 0 to 10 wt % oxidizer; 0.001 to 5 wt % quaternary compound; a material having a formula (I):

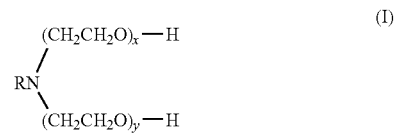

wherein R is selected from $C_2$-$C_{20}$ alkyl, $C_2$-$C_{20}$ aryl, $C_2$-$C_{20}$ aralkyl and $C_2$-$C_{20}$ alkaryl; wherein x is an integer from 0 to 20; wherein y is an integer from 0 to 20; wherein x+y≧1; wherein the chemical mechanical polishing composition has a pH≦5;
providing a chemical mechanical polishing pad;
creating dynamic contact at an interface between the chemical mechanical polishing pad and the substrate; and
dispensing the chemical mechanical polishing composition onto the chemical mechanical polishing pad at or near the interface between the chemical mechanical polishing pad and the substrate;
wherein at least some of the barrier material is removed from the substrate.

2. The method of claim 1, wherein the substrate comprises tantalum nitride in the presence of copper and a low-k dielectric, carbon-doped oxide film.

3. The method of claim 2, wherein the chemical mechanical polishing composition exhibits a tantalum nitride to copper removal rate selectivity of ≧2 and wherein the chemical mechanical polishing composition exhibits a tantalum nitride to low-k dielectric, carbon-doped oxide film removal rate selectivity of ≧3.

4. The method of claim 1, wherein substrate comprises tantalum nitride in the presence of copper and a low-k dielectric, carbon-doped oxide film; wherein the abrasive is a colloidal silica; and wherein the chemical mechanical polishing composition exhibits a tantalum nitride removal rate of ≧800 Å/min with a platen speed of 93 revolutions per minute, a carrier speed of 87 revolutions per minute, a chemical mechanical polishing composition flow rate of 200 ml/min, and a nominal down force of 1.5 psi on a 200 mm polishing machine where the chemical mechanical polishing pad comprises a polyurethane polishing layer containing polymeric hollow core microparticles and a polyurethane impregnated non-woven subpad.

5. A method for chemical mechanical polishing of a substrate, comprising:
providing a substrate, wherein the substrate comprises a barrier material in the presence of at least one of an interconnect metal and a low-k dielectric material;
providing a chemical mechanical polishing composition, wherein the chemical mechanical polishing composition comprises water; 1 to 5 wt % colloidal silica abrasive having an average particle size of 20 to 30 nm; 0.05 to 0.8 wt % oxidizer; 0 to 10 wt % inhibitor; 0.001 to 5 wt % quaternary compound selected from tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetratertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof; 0.01 to 0.1 wt % of a material having a formula (I):

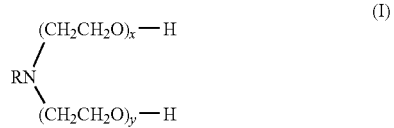

wherein R is a $C_8$-$C_{20}$ alkyl derived from a natural source selected from soy, tallow, coconut, palm oil and castor oil; wherein x is an integer from 0 to 20; wherein y is an integer from 0 to 20; wherein x+y≧1; wherein the chemical mechanical polishing composition has a pH≦5;
providing a chemical mechanical polishing pad;
creating dynamic contact at an interface between the chemical mechanical polishing pad and the substrate; and
dispensing the chemical mechanical polishing composition onto the chemical mechanical polishing pad at or near the interface between the chemical mechanical polishing pad and the substrate;
wherein at least some of the barrier material is removed from the substrate.

6. The method of claim 5, wherein the substrate comprises tantalum nitride in the presence of copper and a low-k dielectric, carbon-doped oxide film.

7. The method of claim 6, wherein the chemical mechanical polishing composition exhibits a tantalum nitride to copper removal rate selectivity of ≧2 and wherein the chemical mechanical polishing composition exhibits a tantalum nitride to low-k dielectric, carbon-doped oxide film removal rate selectivity of ≧3.

8. The method of claim 5, wherein the chemical mechanical polishing composition exhibits a tantalum nitride removal rate of ≧800 Å/min with a platen speed of 93 revolutions per minute, a carrier speed of 87 revolutions per minute, a chemical mechanical polishing composition flow rate of 200 ml/min, and a nominal down force of 1.5 psi on a 200 mm polishing machine wherein the chemical mechanical polishing pad comprises a polyurethane polishing layer containing polymeric hollow core microparticles and a polyurethane impregnated non-woven subpad.

9. The method of claim 6, wherein the chemical mechanical polishing composition exhibits a tantalum nitride removal rate of ≧800 Å/min with a platen speed of 93 revolutions per minute, a carrier speed of 87 revolutions per minute, a chemical mechanical polishing composition flow rate of 200 ml/min, and a nominal down force of 1.5 psi on a 200 mm polishing machine where the chemical mechanical polishing pad comprises a polyurethane polishing layer containing polymeric hollow core microparticles and a polyurethane impregnated non-woven subpad.

10. The method of claim 7, wherein the chemical mechanical polishing composition exhibits a tantalum nitride removal rate of ≧800 Å/min with a platen speed of 93 revolutions per minute, a carrier speed of 87 revolutions per minute, a chemical mechanical polishing composition flow rate of 200 ml/min, and a nominal down force of 1.5 psi on a 200 mm polishing machine where the chemical mechanical polishing pad comprises a polyurethane polishing layer containing polymeric hollow core microparticles and a polyurethane impregnated non-woven subpad.

* * * * *